US006407407B1

(12) United States Patent
Johnson et al.

(10) Patent No.: US 6,407,407 B1
(45) Date of Patent: Jun. 18, 2002

(54) RIDGE LASER WITH OXIDIZED STRAIN-COMPENSATED SUPERLATTICE OF GROUP III-V SEMICONDUCTOR

(75) Inventors: Frederick G. Johnson, Lanham; Bikash Koley; Linda M. Wasiczko, both of College Park, all of MD (US)

(73) Assignee: The United States of America as represented by the Director of the National Security Agency, Washington, DC (US)

( * ) Notice: Subject to any disclaimer, the term of this patent is extended or adjusted under 35 U.S.C. 154(b) by 0 days.

(21) Appl. No.: 09/563,314

(22) Filed: May 2, 2000

Related U.S. Application Data

(60) Provisional application No. 60/132,596, filed on May 5, 1999.

(51) Int. Cl.[7] .............................................. H01L 29/06
(52) U.S. Cl. .............................. 257/18; 257/14; 438/39
(58) Field of Search .................................. 257/18, 9, 11, 257/14, 190

(56) References Cited

U.S. PATENT DOCUMENTS

| 5,262,360 A | | 11/1993 | Holonyak et al. | |
|---|---|---|---|---|
| 5,373,522 A | | 12/1994 | Holonyak et al. | |
| 5,521,935 A | * | 5/1996 | Irikawa | 257/18 |
| 5,567,980 A | | 10/1996 | Holonyak et al. | |
| 5,696,023 A | | 12/1997 | Holonyak et al. | |
| 5,751,753 A | * | 5/1998 | Uchida | 257/190 |
| 5,753,933 A | * | 5/1998 | Morimoto | 257/14 |
| 5,929,462 A | * | 7/1999 | Kasukawa et al. | 257/18 |
| 6,287,884 B1 | * | 9/2001 | Jie et al. | 438/39 |

OTHER PUBLICATIONS

Russell D. Dupuis, "III–V Compound Semiconductor Native Oxides—The Newest of the Semiconductor Device Materials", Compound Semiconductor Jan./Feb. 1997, USA pp. 32–34.

(List continued on next page.)

*Primary Examiner*—David Nelms
*Assistant Examiner*—Andy Huynh
(74) *Attorney, Agent, or Firm*—Robert D. Morelli

(57) ABSTRACT

A ridge laser that includes a Group III-V semiconductor material substrate; a first selectively oxidized at least one strain-compensated superlattice of Group III-V semiconductor material; a multiple quantum well active region; a second selectively oxidized at least one strain-compensated superlattice of Group III-V semiconductor material; a Group III-V semiconductor material cap layer; and a contact material. Each at least one strain-compensated superlattice includes at least two monolayers of a Group III-V semiconductor material and at least two monolayers of an aluminum-bearing Group III-V semiconductor material. In the preferred embodiment, the substrate is InP of any type; each selectively oxidized at least one strain-compensated superlattice of Group III-V semiconductor material is InAs/AlAs, where each at least one superlattice of InAs/AlAs includes at least two monolayers of InAs and at least two monolayers of AlAs; the multiple quantum well active region is InGaAsP lattice matched to the InP substrate, the Group III-V semiconductor material cap layer is InP, and the contact material is gold.

10 Claims, 2 Drawing Sheets

OTHER PUBLICATIONS

J.M Dallesasse et al., "Hydrolyzation Oxidation of $Al_xGa_{1-x}A_sALA_s$–V Quantum Well Heterostructures and Superlattices", Appl. Phys. Lett. $G_aA_s$ vol. 57, No. 26, Dec. 24, 1990, Amer. Inst. of Phys., USA pp. 2844–2846.

H. Gebretsadik et al., "Lateral Oxidation of $INALA_s$ in InP–Based Heterostructures for Long Wavelength Vertical Cavity Surface Emitting Laser Applications", Appl. Phys. Lett., vol. 72, No. 2, Jan. 12, 1998, USA, Amer. Inst. of Phys. pp. 135–137.

P. Legay et al., "Oxide Confining Layer on an InP Sustrate", Journal of Applied Physics, vol. 85, No. 4, Feb. 15, 1999, USA, Amer. Inst. of Phys. pp. 2428–2430.

* cited by examiner

RIDGE LASER WITH OXIDIZED STRAIN-COMPENSATED SUPERLATTICE OF GROUP III-V SEMICONDUCTOR

This application claims the benefit of U.S. Provisional Application No. 60/132,596, filed May 5, 1999.

FIELD OF THE INVENTION

The present invention relates, in general, to a coherent light generator and to a particular current control structure.

BACKGROUND OF THE INVENTION

In an article entitled "III-V Compound Semiconductor Native Oxides—The Newest of the Semiconductor Device Materials," published in *Compound Semiconductor*, January 1997, Russell D. DuPuis chronicled the development of the semiconductor oxide. Mr. DuPuis points out that Carl Frosch, of Bell Telephone Laboratories, disclosed in 1955 that a silicon wafer could be oxidized by exposing it to high temperature (e.g., 1050 degrees Celsius) and water vapor (i.e., steam) in either oxygen or nitrogen to form a layer of silicon dioxide thereon. The oxide, or native oxide, exhibited sufficiently high insulating properties to be used as an insulator in electronic devices manufacture in silicon.

It was widely thought that an insulating oxide could not be grown on Group III-V semiconductor materials with insulating properties as good as silicon dioxide. In 1990, Nick Holonyak, Jr. et al. discovered that such an oxide could be made. The discovery was described in U.S. Pat. Nos. 5,262,360, entitled "AlGaAs NATIVE OXIDE"; U.S. Pat. No. 5,3,73,522, entitled "SEMICONDUCTOR DEVICES WITH NATIVE ALUMINUM OXIDE REGIONS"; U.S. Pat. No. 5,696,023, entitled "METHOD OF MAKING ALUMINUM GALLIUM ARSENIDE SEMICONDUCTOR DEVICE WITH NATIVE OXIDE LAYER"; and U.S. Pat. No. 5,567,980, entitled "NATIVE OXIDE OF AN ALUMINUM-BEARING GROUP III-V SEMICONDUCTOR." U.S. Pat. Nos. 5,262,360; 5,3,73,522; 5,696,023; and 5,567,980 are hereby incorporated by reference into the specification of the present invention. The discovery was also described in an article entitled "Hydrolyzation oxidation of $Al_xGa_{1-x}As$-AlAs-GaAs quantum well heterostructures and superlattices," by J. M. Dallesasse, N. Holonyak, Jr., A. R. Sugg, T. A. Richard, and N. El-Zein, published by the American Institute of Physics in *Appl. Phys. Lett.*, 57, Dec. 24, 1990, pp. 2844–2846. The discovery is, essentially, exposing an aluminum-bearing Group III-V semiconductor material to high temperature (e.g., 375 degrees Celsius) and water vapor in nitrogen until a user-definable portion of the aluminum-bearing Group III-V semiconductor material is oxidized. Partial oxidation is useful in an electronic device for confining current flow to a user-definable path. Complete oxidation is useful in an electronic device for forming an insulator or part of a mirror.

Other relevant prior art includes an article by H. Gebretsadik et al., entitled "Lateral oxidation of InAlAs in InP-based heterostructures for long wavelength vertical cavity surface emitting laser application," published by the American Institute of Physics in *Appl. Phys. Lett.*, Jan. 12, 1998, on pp. 135–137, and an article by P. Legay et al., entitled "Oxide confining layer on an InP substrate," published by the American Institute of Physics in the *Journal of Applied Physics*, Vol. 85, No. 4, Feb. 15, 1999. Each article discloses a method of oxidizing a particular Group III-V semiconductor material on an InP substrate.

Most of the prior art methods of forming an oxide in a Group III-V semiconductor material involve the wet thermal oxidation of an $Al_xGa_{(1-x)}As$ layer because such methods are repeatable and are very controllable. However, such oxidation methods are limited to high aluminum content Group III-V semiconductor materials such as $Al_xGa_{(1-x)}As$ lattice matched to GaAs. Lattices are matched to avoid introducing any strain in the resulting structure which might reduce the reliability of the structure. Devices based on such materials are too slow and operate at the wrong wavelength for use in a fiber optic communication system. However, devices based on Group III-V semiconductor materials lattice matched to Indium Phosphide (InP) are fast enough and operate at the correct wavelength (i.e., 1.2 $\mu$m to 1.6 $\mu$m) for use in a fiber optic communication system. Unfortunately, the only high aluminum containing Group III-V semiconductor materials that are lattice matched to InP are $AlAs_xSb_{(1-x)}$ materials with an x value near 0.5. During the oxidation process, the metallic elements (e.g., As and Sb) separate and forms conductive interfacial layers which lead to increased strain in the oxidized structure. The strain may reduce the reliability of the structure.

There is no x value for which $Al_xGa_{(1-x)}As$ is lattice matched to InP. $Al_yIn_{(1-y)}As$ materials are more suitable but are only lattice matched to InP for y values near 0.48, which is a relatively low aluminum content for oxidation purposes. Therefore, present oxidation methods are not easily transferred to devices based on InP substrates. The maximum aluminum composition of an arsenide-based ternary material that is lattice matched to InP is $Al_{0.48}In_{0.52}As$. Because of the relatively small aluminum content, the oxidation rate in this material is very slow (~1 $\mu$m/hour at 500 degrees Celsius).

SUMMARY OF THE INVENTION

It is an object of the present invention to form a ridge laser using a first and second selectively oxidized at least one strain-compensated superlattice of Group III-V semiconductor material that is not required to be lattice matched to a Group III-V semiconductor material.

It is another object of the present invention to form ridge laser using a first and second selectively oxidized at least one strain-compensated superlattice of Group III-V semiconductor material that was oxidized in a timely manner and is compatible with device production methods so that the devices made therewith are not degraded during the oxidation process.

The present invention is a ridge laser that includes a Group III-V semiconductor material substrate, a first selectively oxidized at least one strain-compensated superlattice of Group III-V semiconductor material, a multiple quantum well active region, a second selectively oxidized at least one strain-compensated superlattice of Group III-V semiconductor material, a Group III-V semiconductor material cap layer, and a a contact material.

In the preferred embodiment, the substrate is InP of any type (i.e., n-type or p-type); each selectively oxidized at least one strain-compensated superlattice of Group III-V semiconductor material is InAs/AlAs, where each at least one superlattice of InAs/AlAs includes at least two monolayers of InAs and at least two monolayers of AlAs; the multiple quantum well active region is InGaAsP lattice matched to the InP substrate; the Group III-V semiconductor material cap layer is InP; and the contact material is gold.

DETAILED DESCRIPTION

The present invention is a ridge laser that includes a first and second selectively oxidized at least one strain-compensated superlattice of Group III-V semiconductor material that is not required to be lattice matched to a Group III-V semiconductor material, is oxidized in a timely manner, and is compatible with device production methods so that the devices made therewith are not degraded during the oxidation process.

Figure 1:
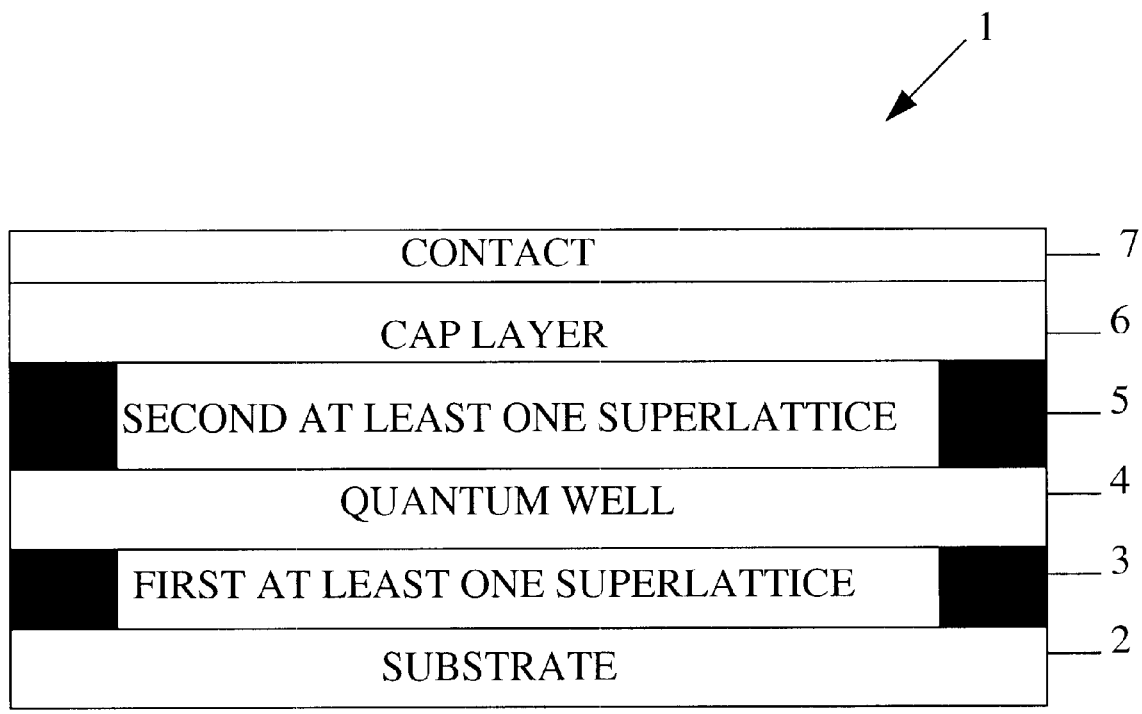
FIG. 1 is cross-sectional view of the present invention.

FIG. 1 is a cross-sectional view of the ridge laser 1 of the present invention. The ridge laser 1 includes a Group III-V semiconductor material substrate 2.

On the Group III-V semiconductor material substrate 2 is a first selectively oxidized at least one strain-compensated superlattice of Group III-V semiconductor material 3, where each at least one strain-compensated superlattice of Group III-V semiconductor material 3 includes at least two monolayers of a Group III-V semiconductor material and at least two monolayers of an aluminum-bearing Group III-V semiconductor material. The Group III-V material without aluminum and the Group III-V material with aluminum have lattice constants that are different from each other and, therefore, may be arranged to cancel out each other so that there is no strain in the resulting superlattice. If the Group III-V material without aluminum and the Group III-V material with aluminum have lattice constants that are exactly opposite from each other then the number of monolayers of the Group III-V semiconductor material that does not include aluminum will be the same as the number of monolayers of the aluminum-bearing Group III-V semiconductor material. However, if the Group III-V material without aluminum and the Group III-V material with aluminum have lattice constants that are not exactly opposite from each other then the number of monolayers of the Group III-V semiconductor material that does not include aluminum may be different from the number of monolayers of the aluminum-bearing Group III-V semiconductor material. That is, the number of monolayers of the Group III-V material without aluminum and the number of monolayers of the Group III-V material with aluminum are set so that there is no strain is in the resulting superlattice. To achieve this, the number of monolayers of the Group III-V material without aluminum may be different from the number of monolayers of the Group III-V material with aluminum. Selective oxidation is how current control is achieved in the ridge laser 1. In the preferred embodiment, the first selectively oxidized at least one strain-compensated superlattice of Group III-V semiconductor material 3 is oxidized from each side so that current only flows in the center which is not oxidized. However, other current control schemes are possible (e.g., oxidation from on one side).

On the first selectively oxidized at least one strain-compensated superlattice of Group III-V semiconductor material 3 is a multiple quantum well active region 4. The multiple quantum well active region 4 is lattice matched to the Group III-V semiconductor material substrate 2.

On the multiple quantum well active region 4 is a second selectively oxidized at least one strain-compensated superlattice of Group III-V semiconductor material 5, where each at least one strain-compensated superlattice of Group III-V semiconductor material 5 includes at least two monolayers of a Group III-V semiconductor material and at least two monolayers of an aluminum-bearing Group III-V semiconductor material. Current in the ridge laser 1 is further controlled by the degree to which the second selectively oxidized at least one strain-compensated superlattice of Group III-V semiconductor material 5 is oxidized.

On the second selectively oxidized at least one strain-compensated superlattice of Group III-V semiconductor material 5 is a Group III-V semiconductor material cap layer 6.

On the Group III-V semiconductor material cap layer 6 is a contact material 7.

Figure 2:
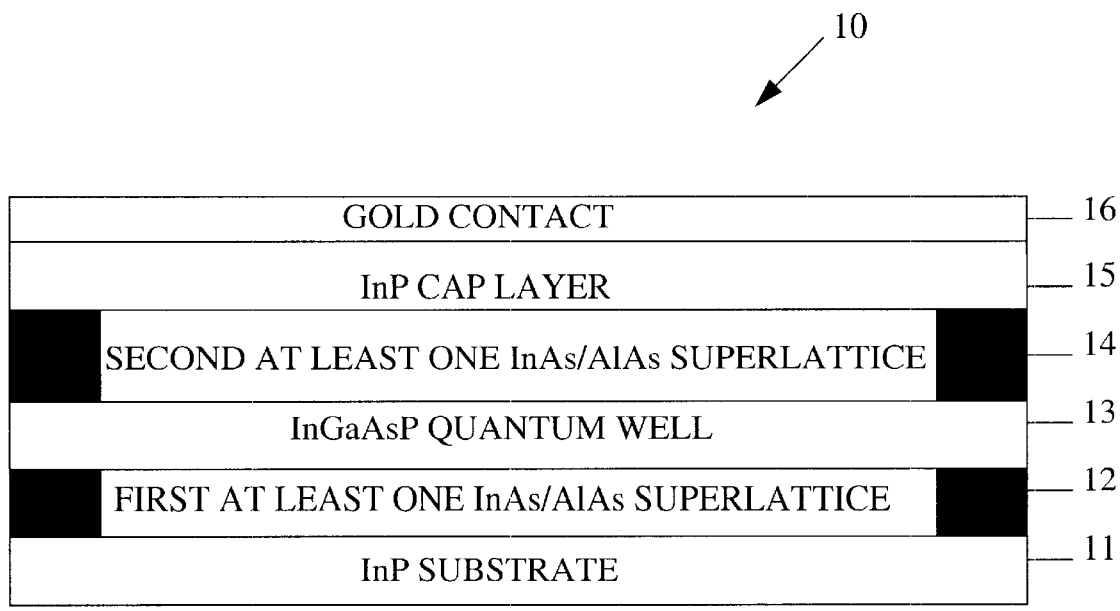
FIG. 2 is cross-sectional view of the preferred embodiment of the present invention.

FIG. 2 is a cross-sectional view of the preferred embodiment 10 of the ridge laser 1 of the present invention. The preferred embodiment 10 includes an InP substrate 11 of any type (i.e., n-type or p-type).

On the InP substrate 11 is a first selectively oxidized at least one strain-compensated superlattice of InAs/AlAs 12, where each at least one strain-compensated superlattice of InAs/AlAs 12 includes at least two monolayers of InAs and at least two monolayers of AlAs.

On the first selectively oxidized at least one strain-compensated superlattice of InAs/AlAs 12 is a multiple quantum well active region of InGaAsP 13 that is lattice matched to the InP substrate On the multiple quantum well active region of InGaAsP 13 is a second selectively oxidized at least one strain-compensated superlattice of InAs/AlAs 14, where each at least one strain-compensated superlattice of InAs/AlAs 14 includes at least two monolayers of InAs and at least two monolayers of AlAs.

On the second selectively oxidized at least one strain-compensated superlattice of InAs/AlAs 14 is a InP cap layer 15.

On the InP cap layer 15 is a gold contact 16.

What is claimed is:

1. A ridge laser, comprising:
   a) a Group III-V semiconductor material substrate;
   b) a first selectively oxidized at least one strain-compensated superlattice of Group III-V semiconductor material on the Group III-V semiconductor material substrate, where each at least one strain-compensated superlattice includes at least two monolayers of a Group III-V semiconductor material and at least two monolayers of an aluminum-bearing Group III-V semiconductor material;
   c) a multiple quantum well active region on the first selectively oxidized at least one strain-compensated superlattice of Group III-V semiconductor material, where the multiple quantum well active region is lattice matched to the Group III-V semiconductor material substrate;
   d) a second selectively oxidized at least one strain-compensated superlattice of Group III-V semiconductor material on the multiple quantum well active region, where each at least one strain-compensated superlattice of Group III-V semiconductor material includes at least two monolayers of a Group III-V semiconductor material and at least two monolayers of an aluminum-bearing Group III-V semiconductor material;
   e) a Group III-V semiconductor material cap layer on the second selectively oxidized at least one strain-compensated superlattice of Group III-V semiconductor material; and
   f) a contact material on the Group III-V semiconductor material cap layer.

2. The device of claim 1, wherein said Group III-V semiconductor material substrate is an InP substrate of any type.

3. The device of claim 1, wherein said first selectively oxidized at least one strain-compensated superlattice of Group III-V semiconductor material and said second selectively oxidized at least one strain-compensated superlattice of Group III-V semiconductor material are each at least one strain-compensated superlattice of InAs/AlAs, where each at least one superlattice of InAs/AlAs includes at least two monolayers of InAs and at least two monolayers of AlAs.

4. The device of claim 1, wherein said multiple quantum well active region is InGaAsP lattice matched to the Group III-V semiconductor material substrate.

5. The device of claim 1, wherein said Group III-V semiconductor material cap layer is InP.

6. The device of claim 1, wherein said contact material is gold.

7. The device of claim 2, wherein said first selectively oxidized at least one strain-compensated superlattice of Group III-V semiconductor material and said second selectively oxidized at least one strain-compensated superlattice of Group III-V semiconductor material are each at least one strain-compensated superlattice of InAs/AlAs, where each at least one superlattice of InAs/AlAs includes at least two monolayers of InAs and at least two monolayers of AlAs.

8. The device of claim 7, wherein said multiple quantum well active region is InGaAsP lattice matched to the InP substrate.

9. The device of claim 8, wherein said Group III-V semiconductor material cap layer is InP.

10. The device of claim 9, wherein said contact material is gold.

* * * * *